(12) United States Patent
Smiley

(10) Patent No.: US 8,143,951 B2
(45) Date of Patent: Mar. 27, 2012

(54) BROADBAND TRANSISTOR BIAS NETWORK

(75) Inventor: Russell Clifford Smiley, Richmond (CA)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 0 days.

(21) Appl. No.: 12/832,338

(22) Filed: Jul. 8, 2010

(65) Prior Publication Data
US 2012/0007678 A1    Jan. 12, 2012

(51) Int. Cl.
*H03F 3/04*    (2006.01)
(52) U.S. Cl. .................................. 330/302; 330/296
(58) Field of Classification Search .......... 330/296–298, 330/302–306
See application file for complete search history.

(56) References Cited

U.S. PATENT DOCUMENTS

| | | | |
|---|---|---|---|
| 4,107,621 A * | 8/1978 | Furutani et al. | ............... 330/296 |
| 5,272,450 A | 12/1993 | Wisherd | |
| 5,315,265 A | 5/1994 | Wisherd et al. | |
| 5,977,834 A | 11/1999 | Davis et al. | |
| 6,392,491 B1 | 5/2002 | Ohkawa et al. | |
| 7,034,620 B2 | 4/2006 | Khanifar et al. | |
| 7,092,691 B2 | 8/2006 | Bohn et al. | |
| 7,257,384 B2 * | 8/2007 | Bar-David et al. | ............ 455/149 |
| 2003/0179048 A1 | 9/2003 | Kolsrud et al. | |
| 2004/0008082 A1 | 1/2004 | Dow | |
| 2007/0188224 A1 | 8/2007 | Dow et al. | |
| 2009/0189696 A1 | 7/2009 | Deng et al. | |

FOREIGN PATENT DOCUMENTS
EP    1 748 487 A2    1/2007

OTHER PUBLICATIONS

Khanifar, A. et al.; "Bias Circuit Topologies for Minimization of RF Amplifier Memory Effects"; Powerwave Technologies Inc., 33rd European Microwave Conference; Munich 2003; pp. 1349-1352.
Partial International Search Report mailed on Oct. 25, 2011 in corresponding International Application No. PCT/IB2011/052765.
Notice regarding Invitation to Pay Additional Fees in Application No. PCT/IB2011/052765 mailed Oct. 25, 2011.

* cited by examiner

*Primary Examiner* — Hieu Nguyen

(74) *Attorney, Agent, or Firm* — Potomac Patent Group PLLC

(57) ABSTRACT

An amplifying circuit for use in, for example, broadband transceivers is described. A bias filter is connected between an amplifying transistor and a power supply to block a wide range of frequencies associated with amplified RF input signals from reaching the power supply, while permitting DC power to reach the transistor.

20 Claims, 5 Drawing Sheets

BROADBAND TRANSISTOR BIAS NETWORK

TECHNICAL FIELD

The present invention generally relates to transistor networks and associated methods and, more particularly, to transistor bias networks and associated methods which can, for example, be used in amplifier circuits associated with broadband communication technologies.

BACKGROUND

During the past years, the interest in using mobile and landline/wireline computing devices in day-to-day communications has increased. Desktop computers, workstations, and other wireline computers currently allow users to communicate, for example, via e-mail, video conferencing, and instant messaging (IM). Mobile devices, for example, mobile telephones, handheld computers, personal digital assistants (PDAs), etc. also allow the users to communicate via e-mail, video conferencing, IM, etc. Mobile telephones have conventionally served as voice communication devices, but through technological advancements they have recently proved to be effective devices for communicating data, graphics, etc. Wireless and landline technologies continue to merge into a more unified communication system, as user demand for seamless communications across different platforms increases.

As these technologies have advanced, applications which use them have likewise advanced to provide users with video streaming and other multimedia services. Such services require higher bandwidth channels between the network and the end user devices to avoid unacceptable latency, among other things. Thus, for example, each successive generation of wireless communication technology which is promulgated by the various standards bodies has typically enabled an end user device to acquire greater bandwidth channels for communication. Such systems are sometimes referred to as "wideband" or "broadband" systems to emphasize the increased bandwidth availability which they provide.

Devices employed in such systems use transceivers to transmit and receive broadband signals. The transmit portions of such devices typically employ an amplifier to amplify the signals prior to coupling the signals to one or more antennas for transmission. Such broadband amplification circuits include transistors. Transistors operating in an AC coupled environment typically include a bias network that decouples the power supply circuit from the signals that are being amplified by the transistor amplifier. Bias networks for relatively narrowband signals typically include a parallel inductor and capacitor arrangement so that they resonate at a frequency that is within the band of frequencies corresponding to the signal being amplified.

An example of a conventional amplifying circuit 100 is provided as FIG. 1. Therein, the matching circuit 102 is designed such that the impedance z4 seen by the matching circuit 102 at point 104 is $Z_{load}$ and the impedance z3 seen looking into the matching circuit at point 106 is the conjugate of $Z_{SPC}$ (i.e., $Z^*_{SPC}$), where $Z_{SPC}$ is the operating impedance of the transistor 108.

The signal to be amplified is injected into the amplifying circuit 100 at point 110. The transistor 108 amplifies the signal by transferring substantially all of the energy (minus losses) from node 112 to the node 104. The energy from the power supply (not shown) which is delivered to node 112 is in a different form than the amplified signal energy which is delivered to node 104, which energy conversion process is intrinsic to the transistor 108's amplification capability.

Also connected to the drain of the transistor 108 is a bias network 114. The drain bias network 114 includes at least one inductor 116 and at least one capacitor 118 connected to one another in parallel, and is used to prevent the signal amplified by the transistor 108 from leaking into the power supply circuits at node 112 and to allow energy to pass from power supply 112 to transistor amplifier 106. When the inductor 116 and the capacitor 118 are at resonance, then together they form a high impedance at the resonant frequency. If this resonant frequency corresponds to the frequency of the signal being amplified, then the amplified signal at node 106 will be substantially blocked from travelling to node 112, and thus onward into the power supply circuitry (not shown) which is connected to node 112.

A problem with the bias network 114 illustrated in FIG. 1 is that when the signal applied to node 110 for amplification contains a wide range of frequencies, then the high impedance associated with resonance of the LC circuit 116, 118 cannot be maintained over the entire range of frequencies associated with the amplified signal. Degradation of the signal at node 106 occurs and there may also be problems caused by signal leakage through node 112 to the power supply circuitry.

Accordingly, it would be desirable to provide amplifying circuits having bias networks and associated methods which avoid the afore-described problems and drawbacks.

SUMMARY

The following exemplary embodiments provide advantages and benefits relative to existing bias networks including, for example, the possibility to reduce the amount of signal degradation and/or leakage associated with transistor-based amplification circuits operating on broadband signals. This can be accomplished by, for example, employing a filter as the bias network instead of a parallel connected LC arrangement. It will be appreciated by those skilled in the art, however, that the claims are not limited to those embodiments which produce any or all of these advantages or benefits and that other advantages and benefits may be realized depending upon the particular implementation.

According to an exemplary embodiment, a broadband multiple frequency RF amplifier configured to amplify multiple frequency RF input signals over an operating bandwidth to drive a load includes a transistor configured to amplify the RF input signals to drive the load, a power supply configured to provide power usable by the transistor to amplify the RF input signals, a bias filter, connected to the transistor and to the power supply, which is configured to couple the power supply to the transistor to supply DC energy from the power supply to the transistor, and which is further configured to block the amplified RF input signals over substantially the entire operating bandwidth from reaching the power supply, and a matching circuit configured to couple the transistor to the load, wherein a first impedance, seen by looking into the matching circuit from the load, is substantially equal to the conjugate impedance of the load, wherein a second impedance, seen looking into the matching circuit from the transistor, is a conjugate of an operating impedance of the transistor, wherein a load impedance, seen by the bias filter, is substantially equal to the operating impedance of the transistor, and wherein a termination impedance of the bias filter on the power supply connection is one of a short circuit and an open circuit.

According to another exemplary embodiment, a method for manufacturing a broadband, multiple frequency RF amplifier which is configured to amplify multiple frequency RF input signals over an operating bandwidth to drive a load includes the steps of determining a load impedance for the amplifier, determining an operating impedance of a transistor, which transistor is configured to amplify the RF input signals to drive the load, using the operating impedance of the transistor and the load impedance to determine first impedance values for elements of a matching circuit, using the operating impedance to determine second impedance values associated with elements of a bias filter, which bias filter is configured to couple a power supply to the transistor to supply DC energy from the power supply to the transistor, and which is further configured to block the amplified RF input signals over substantially the entire operating bandwidth from reaching the power supply, connecting the matching circuit to the transistor and to the load, and connecting the bias filter to the power supply, the transistor and the matching circuit, wherein a first impedance, seen by the matching circuit from the load, is substantially equal to a conjugate of the impedance of the load, wherein a second impedance, seen looking into the matching circuit from the transistor, is a conjugate of the operating impedance of the transistor, wherein a load impedance, seen by the bias filter, is substantially equal to the operating impedance of the transistor, and wherein a termination impedance of the bias filter on the power supply connection is one of a short circuit and an open circuit.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of amplification circuits including MOSFET transistors. However, the embodiments to be discussed next are not limited to these specific types of amplification circuits but may be applied to other such circuits, e.g., those including other types of transistors.

Reference throughout the specification to "one embodiment" or "an embodiment" means that a particular feature, structure, or characteristic described in connection with an embodiment is included in at least one embodiment of the present invention. Thus, the appearance of the phrases "in one embodiment" or "in an embodiment" in various places throughout the specification are not necessarily all referring to the same embodiment. Further, the particular features, structures or characteristics may be combined in any suitable manner in one or more embodiments.

Figure 1:
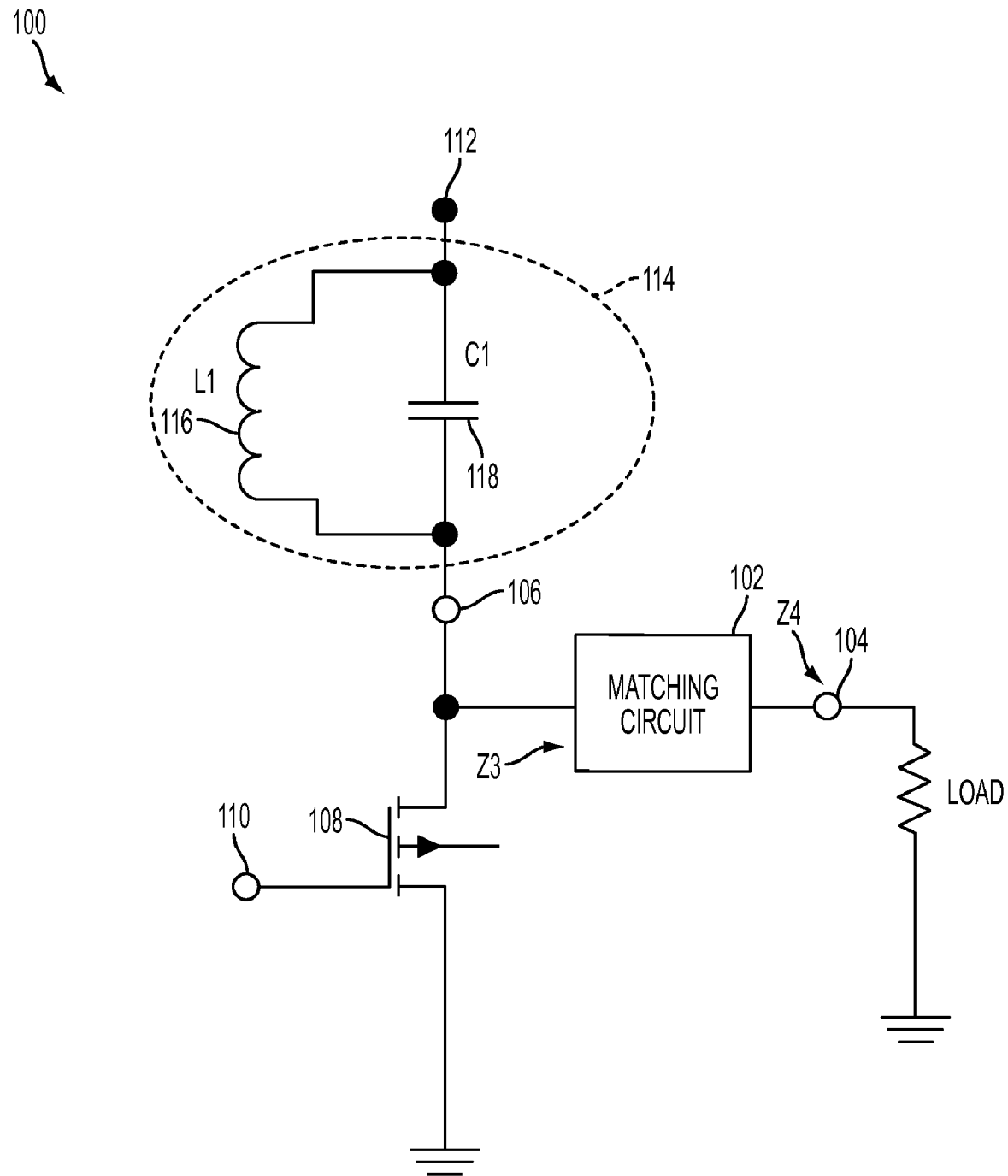
FIG. 1 is a circuit diagram of a conventional amplifying circuit.

According to an embodiment, the parallel connected LC bias network 114 described above with respect to FIG. 1 is replaced with a bias filter which is designed to operate over an arbitrarily wide signal bandwidth, i.e., a bandwidth associated with the particular broadband signal to be amplified. The bias filter is thus designed so as to block amplified signals from entering the power supply while passing the DC energy from the power supply to the transistor. The bias filter is also designed so as to not affect the characteristics of the matching circuitry over the operating bandwidth of the match. This means that, in practice, because the bias filter is designed to have a stopband at the operating frequencies associated with the RF input signals and the matching circuit also operates over those same frequencies, then the bandwidth of the stopband of the bias filter can be made at least equal to the operating frequencies to avoid the consequence that the bias filter would adversely impact the operation of the matching circuit.

Figure 2:
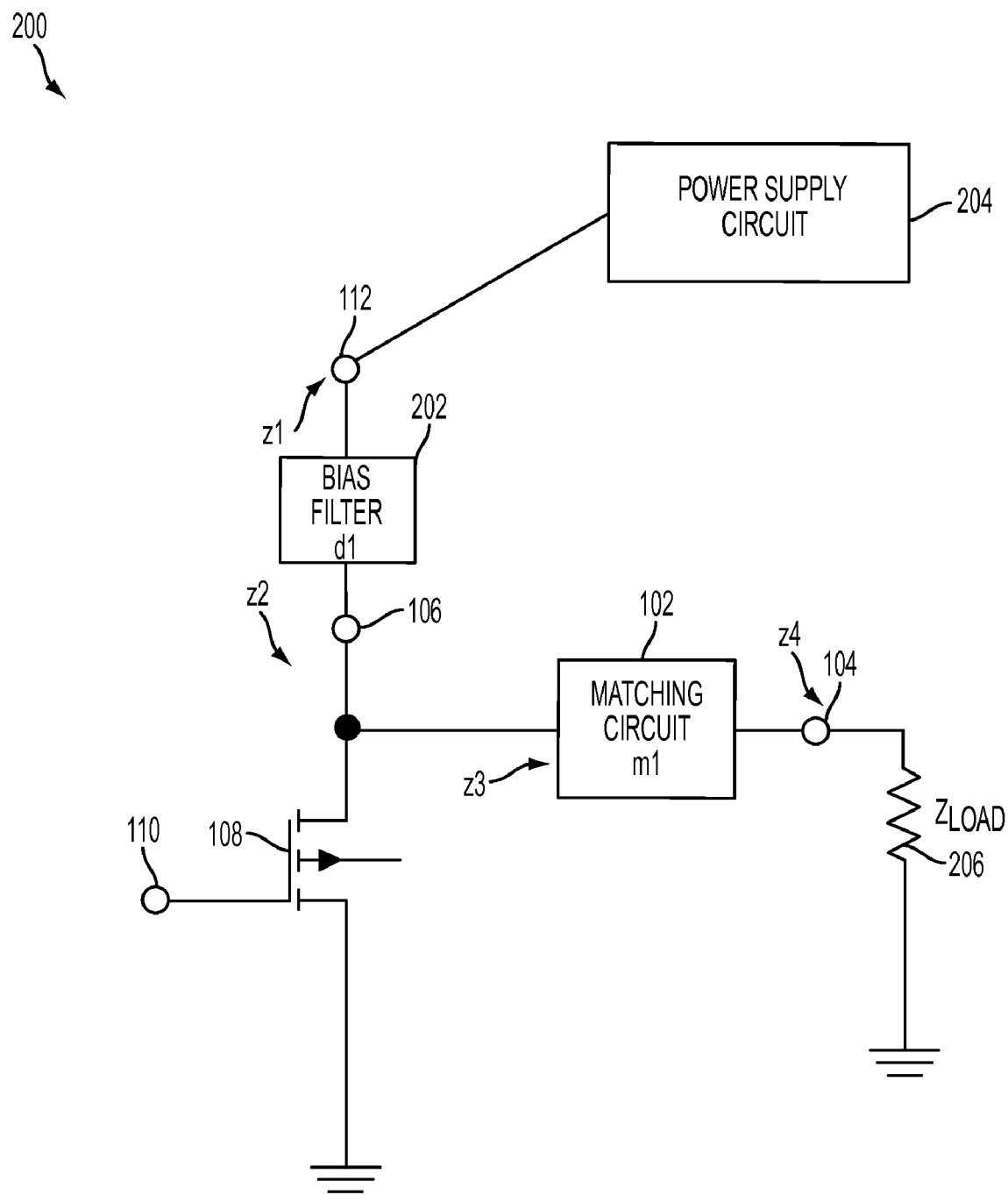
FIG. 2 is a circuit diagram of an amplifying circuit according to an exemplary embodiment.

An amplifying circuit 200 according to an embodiment is illustrated in FIG. 2. Therein, the matching circuit 102, transistor 108, and other elements having the same reference numbers used in FIG. 1 to identify similar elements will be understood to be designed in the same manner, and operate in the same way, as correspondingly numbered elements in the circuit of FIG. 1. The bias filter 202 can, for example, be designed as a singly terminated filter wherein the load impedance z2 seen by the filter 202 is $Z_{SPC}$, i.e., the operating impedance of the transistor 108. The specific design of, and components associated with, the bias filter 202 will vary based on the specifics of the rest of the amplifying circuit 200 for different implementations and signals to be amplified as will be appreciated by those skilled in the art. For more information on filter design which can be used to create bias filters according to these exemplary embodiments, the interested reader is directed to the book entitled "Active and Passive Analog Filter Design" by Huelsman, McGraw-Hill, 1993, the disclosure of which is incorporated here by reference. Additional details regarding methods of manufacturing amplifying circuits according to embodiments are described below with respect to FIG. 3.

Returning first to FIG. 2, the source termination impedance z1 of the singly terminated bias filter 202 is either a short or open circuit depending upon the nature of the power supply circuit 204 to which it is connected. For example, if the power supply circuit 204 is a voltage source, then the source termination of bias filter 202 will be a short circuit. Alternatively, if the power supply 204 is a current source, then the source termination of bias filter 202 will be an open circuit.

The bias filter 202 can, for example, be implemented as either a lowpass filter or a bandstop filter which will reject the frequencies associated with the RF input signals (and amplified RF input signals), but which will pass DC signals, i.e., power from the power supply circuit 204. Thus, a highpass or bandpass filter would generally not be a suitable choice for use as bias filter 202.

Figure 3:
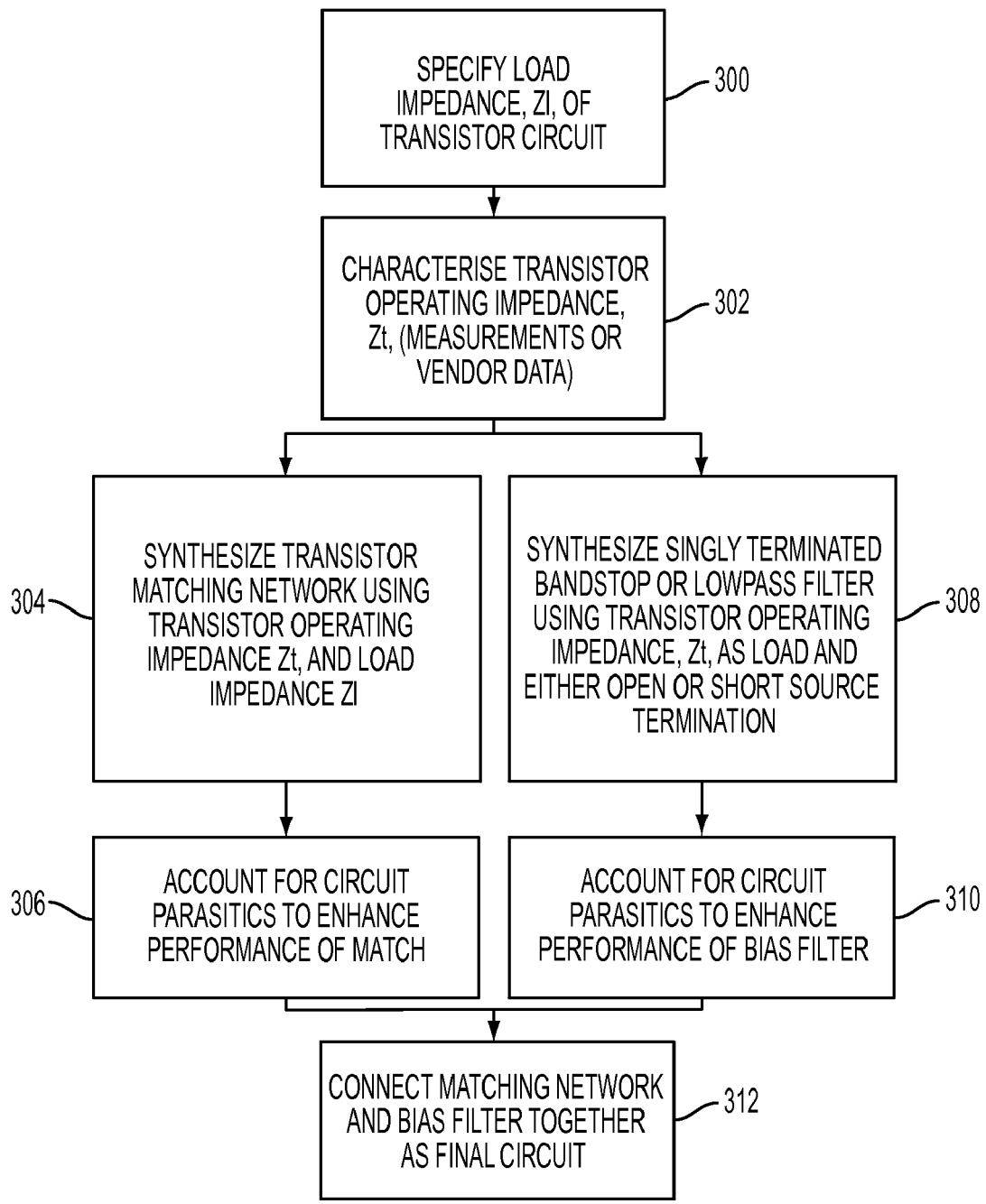
FIG. 3 is a flow chart depicting a method of manufacturing an amplifying circuit according to an exemplary embodiment.

As mentioned above, embodiments also consider a method for manufacturing a transistor amplifier using a bias filter, an example of which is illustrated in FIG. 3. Initially, at step 300, a load impedance $Z_{load}$ 206 of the amplifying circuit is specified or determined for a given implementation. Similarly, the transistor 108's operating impedance is also determined or characterized at step 302. The inputs 300 and 302 may be obtained by, for example, either taking impedance measurements of the circuit elements or from the technical specifications of the vendors which sell the transistor elements 108 and load elements 206.

Given these inputs, the process continues to design the matching circuit 102 and bias filter 202, in steps 304, 306 and 308, 310, respectively. More specifically, the matching circuit or network 102 is synthesized using the transistor operating impedance $Z_{SPC}$ and the load impedance $Z_{load}$ at step 304. Then, the resulting matching network parameters, i.e., capacitance, inductance and/or resistance values, can be modified at step 306 to account for circuit parasitics, i.e., unintended capacitance, inductance and/or resistance generated by the placement of various circuit elements, connecting traces, board dielectric, etc.

On the right hand side of FIG. 3, the design of the bias filter 202 includes the step 308 of synthesizing the bandstop or lowpass filter using the transistor's operating impedance $Z_{SPC}$ which was determined at step 302, and either an open or short source termination as described above and using, for example, the principles discussed in the above-incorporated by reference filter design book (and/or filter synthesis software which operates based upon such principles) to determine impedance values for elements of the bias filter 202. Again, parasitics can be accounted for at step 310 to enhance performance of the bias filter 202. Although illustrated as parallel processes in FIG. 3, it will be appreciated by those skilled in the art that the design of the matching circuit 102 and bias network 202 can be performed serially, and in any desired order. Once the design is completed, the electrical components (e.g., resistors, capacitors, inductors, transistor, connecting traces, etc.) may be mounted on a circuit board and connected together, as indicated generally by step 312, in order to complete the manufacture of the amplifying circuit 200. More specifically, and for example, the matching circuit 102 can be connected to the transistor 108 and to the load 206, and the bias filter 202 can be connected to the power supply 204, the transistor 108 and the matching circuit 102.

Although not shown in FIG. 3, compensation for the parasitics associated with the power supply 204 (essentially those parts of the power supply that make it not an ideal voltage or current source) can be incorporated into the bias filter design portion of the method of FIG. 3 as well.

Based on the foregoing discussion, it will be appreciated that, according to an embodiment, a broadband multiple frequency RF amplifier configured to amplify multiple frequency RF input signals over an operating bandwidth to drive a load includes a transistor 108 configured to amplify the RF input signals to drive the load 206, a power supply 204 configured to provide power usable by the transistor 108 to amplify the RF input signals, a bias filter 202, connected to the transistor 108 and to the power supply 204, which is configured to couple the power supply 204 to the transistor 108 to supply DC energy from the power supply 204 to the transistor 108, and which is further configured to block the amplified RF input signals over substantially the entire operating bandwidth from reaching the power supply 204, and a matching circuit 102 configured to couple the transistor 108 to the load 206, wherein a first impedance, seen by the matching circuit 102 from the load 206, is substantially equal to the conjugate impedance of the load 206, wherein a second impedance, seen looking into the matching circuit 102 from the transistor 108, is a conjugate of an operating impedance of the transistor 108, wherein a load impedance, seen by the bias filter 202, is substantially equal to the operating impedance of the transistor 108, and wherein a termination impedance of the bias filter 202 on the power supply connection is one of a short circuit and an open circuit. Note in this regard that the conjugate impedance of the load 206 may be a complex conjugate if capacitance and or inductive impedances are included as load elements.

As mentioned earlier, although transistor 108 is depicted in the Figures as a MOSFET transistor, amplifying circuits according to these exemplary embodiments may employ any desired type of transistors. Such transistors include, but are not limited to MOSFET, JFET, FET, HBT, MESFET and bipolar transistors.

Figure 4:
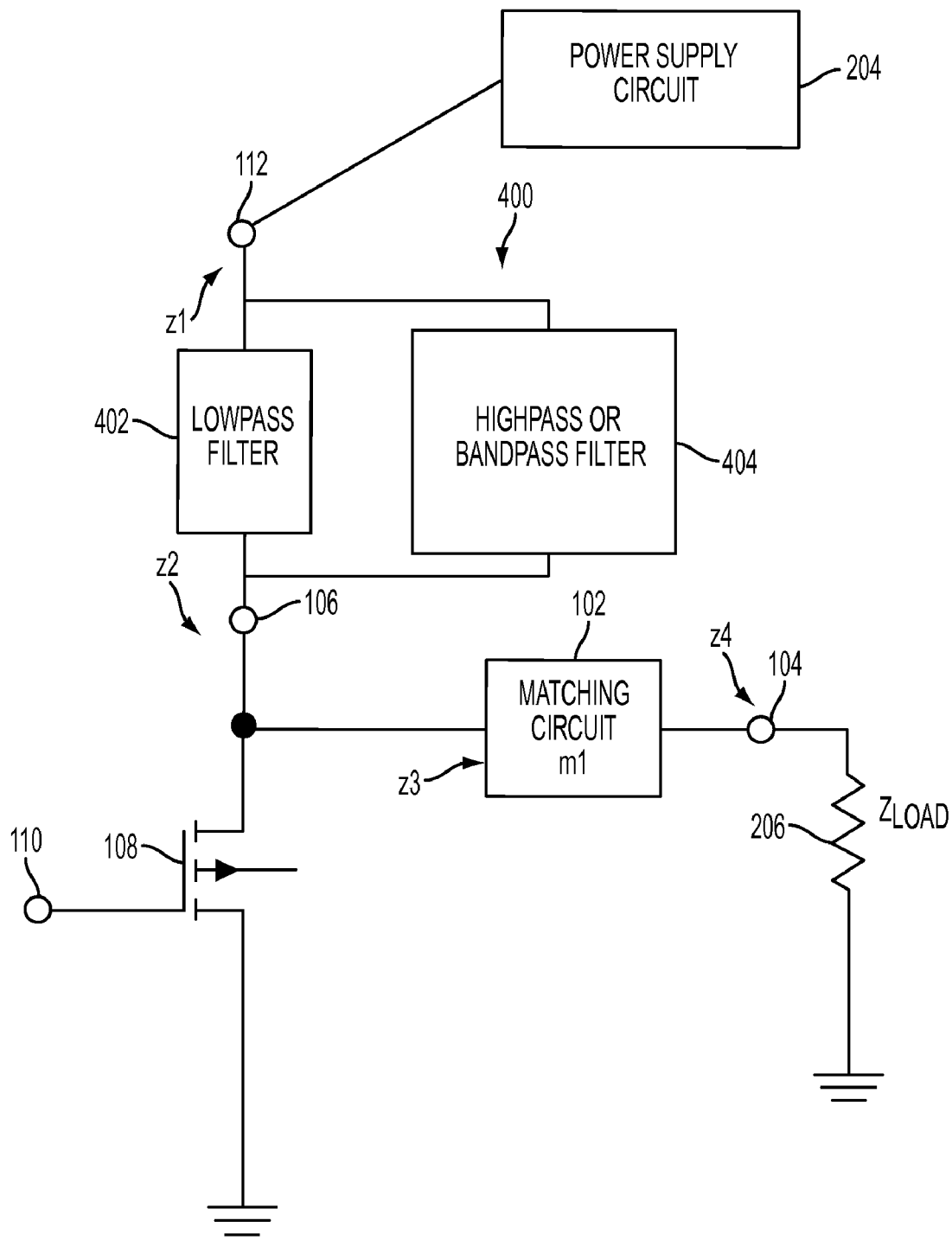
FIG. 4 is a circuit diagram of an amplifying circuit according to an exemplary embodiment including a diplexer filter.

Although the bias filter 202 according to exemplary embodiments may be designed as any desired filter or combination of filters which operate in accordance with the aforedescribed principles, some more specific (yet purely illustrative) examples of such bias filters 202 will now be described with respect to FIGS. 4 and 5. Starting with FIG. 4, the bias filter 202 is implemented in this embodiment as a diplexer filter 400 which includes a parallel connected lowpass filter 402 and highpass or bandpass filter 404 disposed between the power supply circuit 204 and the transistor 108. In this exemplary embodiment, the lowpass filter 402 operates to pass DC energy from the power supply circuit 204 to the transistor 108, while the highpass or bandpass filter 404 operates to block frequencies within the operating bandwidth from reaching the power supply 404.

Figure 5:
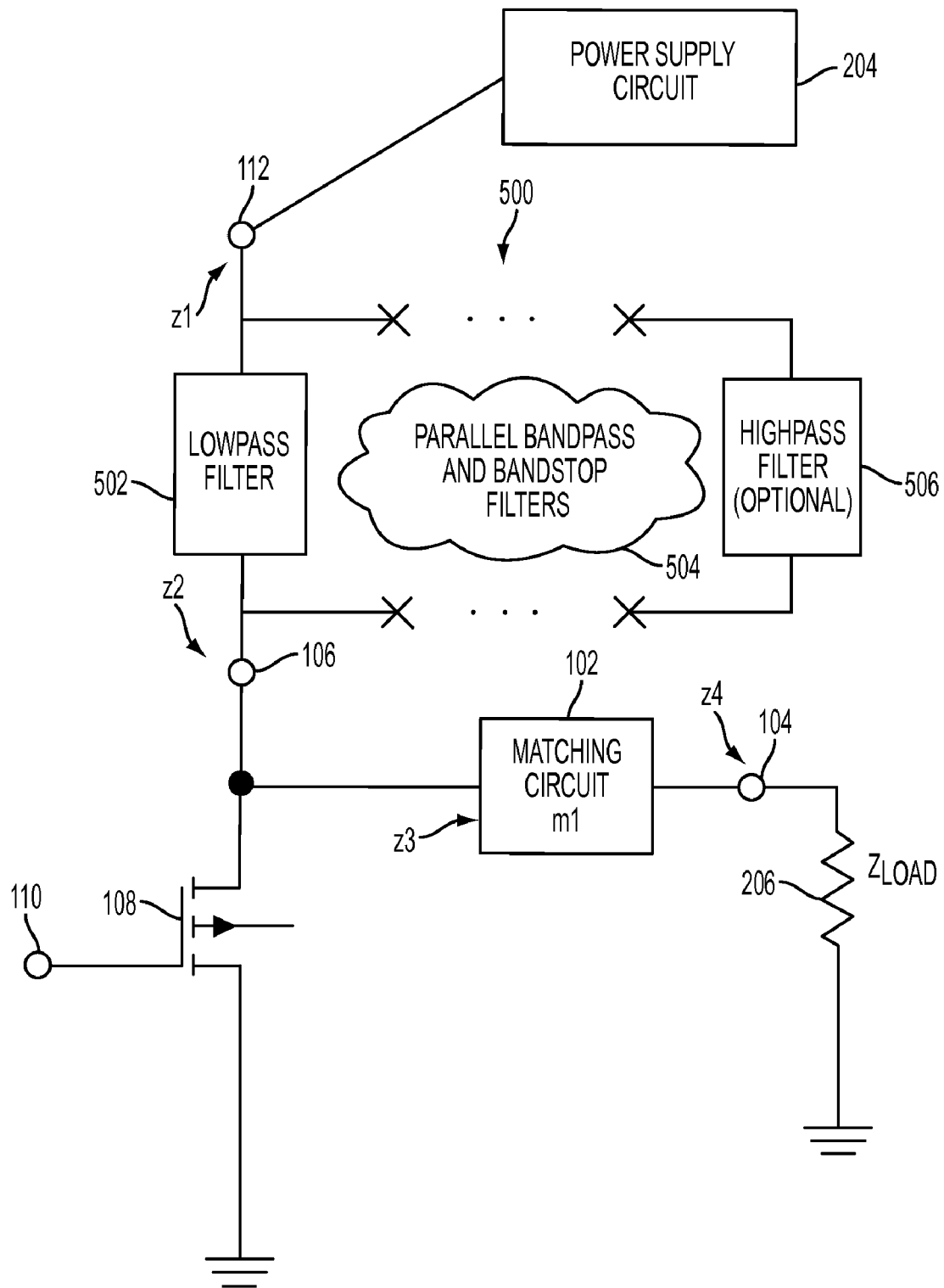
FIG. 5 is a circuit diagram of an amplifying circuit according to another exemplary embodiment including a multiplexer filter.

FIG. 5 depicts another exemplary embodiment of a multiplexer filter design for bias filter 202. Therein, the multiplexer filter 500 includes a lowpass filter 502, one or more parallel bandpass and/or bandstop filters 504 and an optional highpass filter 506, all connected to one another in parallel between the power supply 204 circuit and the transistor 108. In this exemplary embodiment, the lowpass filter 502 operates to pass DC energy from the power supply 204 to the transistor 108, while the other ones of the multiple filters 504, 506 operate to selectively block signals having other frequencies. For example, if multiple stopbands are desirable to block signals (e.g., at the frequency band of the RF input signals and at lower (video) frequencies) this embodiment can be implemented.

Although the features and elements of the embodiments are described in those embodiments in particular combinations, each feature or element can be used alone without the other features and elements of the embodiments or in various combinations with or without other features and elements disclosed herein. The methods or flow charts provided in the present application may be implemented, at least in part, in a computer program, software, or firmware tangibly embodied in a computer-readable storage medium for execution by a general purpose computer or a processor. This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The invention claimed is:

1. A broadband multiple frequency RF amplifier configured to amplify multiple frequency RF input signals over an operating bandwidth to drive a load, the amplifier comprising:
   a transistor configured to amplify the RF input signals to drive the load;
   a power supply configured to provide power usable by said transistor to amplify the RF input signals;

a bias filter, connected to said transistor and to said power supply, which is configured to couple the power supply to the transistor to supply DC energy from the power supply to the transistor, and which is further configured to block the amplified RF input signals over substantially the entire operating bandwidth from reaching the power supply; and a matching circuit configured to couple the transistor to the load, wherein a first impedance, seen by the matching circuit from the load, is substantially equal to a conjugate of the impedance of the load;

wherein a second impedance, seen looking into the matching circuit from the transistor, is a conjugate of an operating impedance of the transistor;

wherein a load impedance, seen by the bias filter, is substantially equal to the operating impedance of the transistor, and wherein a termination impedance of said bias filter on the power supply connection is one of a short circuit and an open circuit.

2. The amplifier of claim 1, wherein said bias filter is a singly terminated low pass filter.

3. The amplifier of claim 1, wherein said bias filter is a singly terminated bandstop filter.

4. The amplifier of claim 1, wherein said bias filter is a duplexer filter comprised of two filters connected in parallel, wherein one of said two filters is a lowpass filter which is configured to pass direct current from said power supply to said transistor, and wherein another of said two filters is a highpass or bandpass filter which is configured with a stopband high enough to prevent frequencies within said operating bandwidth from passing to the power supply.

5. The amplifier of claim 1, wherein said bias filter is a multiplexer filter comprised of multiple filters connected in parallel, wherein one of said multiple filters passes DC from the power supply to the transistor, and wherein a remaining one or more of said multiple filters selectively block or pass specific operating frequencies within said operating bandwidth.

6. The amplifier of claim 5, wherein said remaining one or more of said multiple filters includes at least one bandstop, bandpass or highpass filter.

7. The amplifier of claim 1, wherein said termination impedance of said bias filter is a short circuit if said power supply is a voltage source.

8. The amplifier of claim 1, wherein said termination impedance of said bias filter is an open circuit if said power supply is a current source.

9. The amplifier of claim 1, wherein said transistor is one of a MOSFET, JFET, FET, HBT, MESFET and bipolar transistor.

10. A method for manufacturing a broadband, multiple frequency RF amplifier which is configured to amplify multiple frequency RF input signals over an operating bandwidth to drive a load, the method comprising:

determining a load impedance for the amplifier;

determining an operating impedance of a transistor, which transistor is configured to amplify the RF input signals to drive the load;

using said operating impedance of said transistor and said load impedance to determine first impedance values for elements of a matching circuit;

using said operating impedance to determine second impedance values associated with elements of a bias filter, which bias filter is configured to couple a power supply to the transistor to supply DC energy from the power supply to the transistor, and which is further configured to block the amplified RF input signals over substantially the entire operating bandwidth from reaching the power supply;

connecting said matching circuit to said transistor and to said load; and connecting said bias filter to said power supply, said transistor and said matching circuit, wherein a first impedance, seen looking into the matching circuit from the load, is substantially equal to the conjugate impedance of the load;

wherein a second impedance, seen looking into the matching circuit from the transistor, is a conjugate of the operating impedance of the transistor;

wherein a load impedance, seen by the bias filter, is substantially equal to the operating impedance of the transistor, and wherein a termination impedance of said bias filter is one of a short circuit and an open circuit.

11. The method of claim 10, wherein said bias filter is a singly terminated low pass filter.

12. The method of claim 10, wherein said bias filter is a singly terminated bandstop filter.

13. The method of claim 10, wherein said bias filter is a duplexer filter comprised of two filters connected in parallel, wherein one of said two filters is a lowpass filter which is configured to pass direct current from said power supply to said transistor, and wherein another of said two filters is a highpass or bandpass filter which is configured with a stopband high enough to prevent frequencies within said operating bandwidth from passing to the power supply.

14. The method of claim 10, wherein said bias filter is a multiplexer filter comprised of multiple filters connected in parallel, wherein one of said multiple filters passes DC from the power supply to the transistor, and wherein the remaining one or more of said multiple filters selectively block or pass specific operating frequencies within said operating bandwidth.

15. The method of claim 14, wherein said remaining one or more of said multiple filters includes at least one bandstop, bandpass or highpass filter.

16. The method of claim 10, wherein said termination impedance of said bias filter is a short circuit if said power supply is a voltage source.

17. The method of claim 10, wherein said termination impedance of said bias filter is an open circuit if said power supply is a current source.

18. The method of claim 10, wherein said transistor is one of a MOSFET, JFET, FET, HBT, MESFET and bipolar transistor.

19. The method of claim 10, further comprising the step of:

adjusting the bias filter to account for circuit parasitics in the transistor and matching circuitry.

20. The method of claim 10, further comprising the step of:

adjusting the bias filter to account for circuit parasitics in the power supply.

* * * * *